United States Patent [19]
Kulesza et al.

[11] Patent Number: 5,918,364
[45] Date of Patent: *Jul. 6, 1999

[54] METHOD OF FORMING ELECTRICALLY CONDUCTIVE POLYMER INTERCONNECTS ON ELECTRICAL SUBSTRATES

[75] Inventors: Frank W. Kulesza, Winchester, Mass.; Richard H. Estes, Hollis, N.H.

[73] Assignee: Polymer Flip Chip Corporation, Billerica, Mass.

[*] Notice: This patent is subject to a terminal disclaimer.

[21] Appl. No.: 08/818,634

[22] Filed: Mar. 14, 1997

Related U.S. Application Data

[60] Continuation of application No. 08/387,024, Feb. 10, 1995, Pat. No. 5,611,140, which is a division of application No. 08/107,498, Aug. 17, 1993, which is a continuation-in-part of application No. 07/810,513, Dec. 19, 1991, Pat. No. 5,237,130, which is a division of application No. 07/452,191, Dec. 18, 1989, Pat. No. 5,074,947.

[51] Int. Cl.$^6$ ............................................ H05K 3/30
[52] U.S. Cl. .................. 29/832; 29/840; 156/299; 156/307.3; 156/310; 156/315
[58] Field of Search ................. 29/25, 35, 832, 29/840; 156/307.3, 299, 310, 315; 437/183; 428/901

[56] References Cited

U.S. PATENT DOCUMENTS

| | | | |
|---|---|---|---|
| 2,014,524 | 9/1935 | Franz | 175/359 |
| 2,774,747 | 12/1956 | Wolfson et al. | 260/32.8 |
| 3,401,126 | 9/1968 | Miller et al. | 252/514 |
| 3,429,040 | 2/1969 | Miller . | |
| 3,757,075 | 9/1973 | Munt | 219/121 |
| 3,971,610 | 7/1976 | Buchoff et al. | 174/254 |
| 4,113,981 | 9/1978 | Fujita et al. | 174/88 |
| 4,157,932 | 6/1979 | Hirata | 156/310 |
| 4,442,966 | 4/1984 | Jourdain et al. | 228/123 |
| 4,554,033 | 11/1985 | Dery et al. | 156/52 |

(List continued on next page.)

FOREIGN PATENT DOCUMENTS

| | | |
|---|---|---|
| 0299894 | 1/1989 | European Pat. Off. . |
| 0303256 | 6/1989 | European Pat. Off. . |
| 0473976 | 3/1992 | European Pat. Off. . |
| 3702354 | 7/1987 | Germany . |
| 56167340 | 12/1981 | Japan . |
| 82176738 | 7/1982 | Japan . |
| 60-1849 | 1/1985 | Japan . |
| 61-229342 | 10/1986 | Japan . |
| 62-104142 | 5/1987 | Japan . |
| 62-283644 | 12/1987 | Japan . |

(List continued on next page.)

OTHER PUBLICATIONS

Davis et al., "Solid Logic Technology: Versatile, High–Performance Microelectronics," *IBM Journal*, vol. 8, pp. 102–114, Apr. 1964.

Totta et al., "SLT Device Metallurgy and its Monolithic Extension," *IBM Journal of Research Development*, vol. 12, pp. 226–238, May 1969.

(List continued on next page.)

*Primary Examiner*—Carl J. Arbes
*Attorney, Agent, or Firm*—Theresa A. Lober

[57] ABSTRACT

A method is presented for forming a bumped substrate and for forming an electrical circuit which includes the bumped substrate. The method of forming the bumped substrate includes forming at least one electrically conductive polymer bump on each of a first set of bond pads of the substrate. At least one electrically conductive polymer bump is then formed on each of a second set of the bond pads of the substrate. The circuit is formed by selectively forming an organic protective layer around the bond pads of a second substrate by laser ablation of an organic protective coating polymer bumps on the first and second portions of the bond pads of the first substrate are then contacted with the bond pads of the second substrate, thereby forming the electrical circuit.

14 Claims, 3 Drawing Sheets

U.S. PATENT DOCUMENTS

| | | | |
|---|---|---|---|
| 4,587,038 | 5/1986 | Tamura | 252/511 |
| 4,612,083 | 9/1986 | Yasumoto et al. . | |
| 4,640,981 | 2/1987 | Dery et al. | 174/88 |
| 4,648,179 | 3/1987 | Bhattacharyya et al. | 29/832 |
| 4,695,404 | 9/1987 | Kwong | 252/514 |
| 4,719,140 | 1/1988 | Hara et al. | 428/138 |
| 4,764,804 | 8/1988 | Sahara et al. . | |
| 4,818,728 | 4/1989 | Rai et al. | 29/830 |
| 4,840,302 | 6/1989 | Gardner et al. | 228/123 |
| 4,872,261 | 10/1989 | Sanyal et al. | 29/840 |
| 4,914,057 | 4/1990 | Gloton . | |
| 4,917,466 | 4/1990 | Nakamura et al. | 350/336 |
| 4,922,321 | 5/1990 | Arai et al. . | |
| 4,967,314 | 10/1990 | Higgins, III | 361/414 |
| 4,985,107 | 1/1991 | Conroy et al. | 156/299 |
| 4,991,000 | 2/1991 | Bone et al. . | |
| 5,001,302 | 3/1991 | Atsumi | 174/94 |
| 5,068,714 | 11/1991 | Seipler | 357/80 |
| 5,074,947 | 12/1991 | Estes et al. . | |
| 5,086,558 | 2/1992 | Grube et al. | 29/832 |
| 5,090,119 | 2/1992 | Tsuda | 29/843 |
| 5,147,210 | 9/1992 | Patterson et al. | 439/91 |
| 5,187,020 | 2/1993 | Kwon et al. . | |
| 5,196,371 | 3/1993 | Kulesza et al. . | |
| 5,218,234 | 6/1993 | Thompson et al. . | |
| 5,270,253 | 12/1993 | Arai et al. . | |
| 5,290,423 | 3/1994 | Helber, Jr. et al. . | |
| 5,329,423 | 7/1994 | Scholz . | |
| 5,508,228 | 4/1996 | Nolan et al. . | |
| 5,674,780 | 10/1997 | Lytle et al. . | |

FOREIGN PATENT DOCUMENTS

| | | | |
|---|---|---|---|
| 63-122133 | 5/1988 | Japan . | |
| 63220533 | 9/1988 | Japan . | |
| 63-275127 | 11/1988 | Japan | H01L 21/60 |
| 63283144 | 11/1988 | Japan . | |
| 018647 | 1/1989 | Japan . | |
| 0181181 | 3/1989 | Japan . | |
| 01251643 | 8/1989 | Japan . | |
| 01305541 | 12/1989 | Japan . | |
| 3-504064 | 2/1990 | Japan | H01L 21/92 |
| 9114014 | 4/1991 | WIPO . | |
| 9207378 | 4/1992 | WIPO . | |

OTHER PUBLICATIONS

Miller, "Controlled Collapse Reflow Chip Joining," *IBM Journal of Research Development*, vol. 12, pp. 239–250, May 1969.

Cubert et al., "Face–down bonding of monolithic integrated circuit logic arrays," *IEEE Electronic Component Conference*, pp. 156–167, 1966.

Stein et al., "Some practical considerations in the fabrication of printed glaze resistors and circuits," *IEEE Electronic Component Conference*, pp. 8–16, 1966.

Scharf et al., "Flip–Component Technology," *IEEE Electronic Component Conference*, pp. 269–275, 1967.

Miller, "Paste Transfer in the Screening Process," *Solid State Technology*, vol. 6, pp. 46–52, Jun. 1969.

Ohanian, "Bonding Techniques for Microelectronics," *SCP and Solid State Technology*, vol. 10, pp. 45–52, Aug. 1967.

Goldman et al., "Lead–Indium for Controlled–Collapse Chip Joining," *IEEE Electronic Component Conference*, pp. 25–29, 1977.

Utz, "Better Solder Printing with Stencils?" *Circuit Manufacturing*, vol. 25, No. 9, pp. 43–46, Oct. 1985.

Gabrykewicz et al., "Glob Top Material Selection for Flip Chip Devices," vol. 10, pp. 707–713, 1986.

Gileo, "Direct Chip Interconnect Using Polymer Bonding," $39^{th}$ *IEEE Electronic Component Conference*, pp. 37–44, May 1989.

Leung et al., "Flexible Epoxy Polymer Thick Film Inks," *NEPCON EAST*, Proceedings, pp. 525–538, Jun. 1987.

Suryanarayana et al., "Flip–Chip Solder Bump Fatigue Life Enhanced by Polymer Encapsulation," *IEEE Electronic Component Conference*, pp. 338–344, 1990.

Hatada et al., "Application to the Electronic Instrument by Transferred Bump–Tab Technology," $3^{rd}$ *IEEE CHMT int. Elect. Man. Tech. Symp.*, pp. 81–86, 1987.

Suhir, "Calculated thermally induced stresses in adhesive bonded and soldered assemblies," *Proc. 1986 Int. Symposium on Microelectronics*, pp. 383–392, 1986.

Kusagaya et al., "Flip Chip Mounting using Stud Bumps and Adhesives for Encapsulation," *International Conference on Multichip Modules*, pp. 238–245, 1993.

Hatada et al., "A New LSI Bonding Technology 'Micron Bump Bonding Assembly Technology,'" $5^{th}$ *IEEE CHMT Int. Elect. Man. Tech. Symp.*, pp. 23–27, 1988.

"Wafer Surface Protection Achieved with Screen Printable Polyimide," Industry News, *Semiconductor International*, Jun. 1987.

EPO–TEK® 600 Product Specification, Epoxy Technology, as referred to in *Semiconductor International*, Jun. 1987.

Kulesza et al., "A Screen–Printable Polyimide Coating for Silicon Wafers," *Solid State Technology*, Jan. 1988.

Schneider, "Flip–Chip Bonding Offers Packaging Alternative," *Hybrid Circuit Technology*, pp. 29–31, Mar. 1988.

Kulesza et al., "Solderless Flip–Chip Technology," *Hybrid Circuit Technology*, Feb. 1992.

Jenczewski, "Stencil Metal Masks for Fine–Pitch Printing," *Surface Mount Technology*, pp. 45–46, Jun. 1992.

"'Scavenging' for Fine Pitch Quality," *Surface Mount Technology*, pp. 13–14, Jun. 1992.

EPO–TEK® H20E–PFC Electrically Conductive Silver Epoxy, Epoxy Technology Product Specification, Sep. 1992.

EPO–TEK® 688–PFC PFC Silicon Wafer Coating, Epoxy Technology Product Specification, Oct. 1992.

Mandal, "Evaluation of Advanced Microelectronic Fluxless Solder–Bump Contacts for Hybrid Microcircuits," NASA Contractor Report. NAS 8–31496, Jun. 1976.

Szczepanski, "Promising Techniques in On–Chip Assembly of Semiconducting Components and Monolithic Integrated Circuits," NAS 13–33 77A31551, *Electronika*, pp. 57–61, 1977.

Doo et al., "Semiconductor Chip Cooling Package," *IBM Technical Disclosure Bulletin*, vol. 20, No. 4, pp. 1440, Sep. 1977.

Kawanobe et al., "Solder Bump Fabrication by Electrochemical Method For Flip Chip Interconnection," Proceedings, 31st–IEEE Electronic Components Conference, Atlanta, GA, 1981.

Delfs, In: Modern Aufbau–Und Verbindungstechniken in der Mikroelektronik Proceedings Seminar, Berlin, 1982.

Ginsberg, "Chip–On–Board Profits From TAB and Flip–Chip Technology," *Electronic Packaging and Production,* vol. 25, No. 9, p. 140, 1985.

Shumay, "Microjoining for Electronics," *Advanced Materials & Processes,* vol. 130, No. 5, pp. 38–42, 1986.

Markstein, "TAB Leads as COB Format," *Electronic Packaging and Production,* vol. 27, No. 10, pp. 46–48, Oct., 1987.

Estes "Fabrication and Assembly Processes for Solderless Flip Chip Assemblies," Proceedings, 1992 International Society for Hybrid Microelectronics Conference, pp. 322–335, 1992.

METHOD OF FORMING ELECTRICALLY CONDUCTIVE POLYMER INTERCONNECTS ON ELECTRICAL SUBSTRATES

CROSS REFERENCE TO RELATED APPLICATIONS

This is a Continuation of Ser. No. 08/387,024 filed Feb. 10, 1995, now U.S. Pat. No. 5,611,140, which is a Divisional application of Ser. No. 08/107,498 filed Aug. 17, 1993 which is a Continuation-in-Part of application Ser. No. 07/810,513, filed Dec. 19, 1991, now U.S. Pat. No. 5,237,130, which is a divisional of application Ser. No. 07/452,191, filed Dec. 18, 1989, now U.S. Pat. No. 5,074,947, the teachings of which are incorporated by reference.

BACKGROUND OF THE INVENTION

Integrated circuits have had almost universal application to communication and military technologies for several years. Of increasing importance has been development of microcircuit wafers and methods for interconnection of the circuits by automated equipment. A primary limitation to application of microcircuit technology has been cost efficiency and reliability of interconnection of integrated circuits on chips because of the small size of the chips, which often require hundreds of connections to be made within each circuit.

One method of circuit interconnection is called flip chip bonding. Flip chip bonding can offer a shorter signal path and, therefore, more rapid communication between circuits than can other methods, such as tape automated bonding (TAB) or conventional wire bonding, because bond pads on flip chips are not restricted to the periphery of the chip, but rather are usually located at one face of the chip opposite a substrate. In one method of flip chip bonding, a chip or die is formed with the requisite integrated circuit and interconnect wiring required for interconnecting the circuit with other chip circuits on a circuit board, such as a separate printed circuit board or substrate. Bond pads are located at points of interconnection. Bumps are formed by plating of several layers of metals on the bond pads of the flip chips. Following deposition, the chip is heated to reflow the metals, thus causing surface tension of the deposit to form hemispherical solider "bumps." The flip chip is subsequently severed from the wafer of which it was a part and "flipped" for alignment with the bond pads of a substrate. These bumps are then contacted with the bond pads of the substrate and uniformly heated to simultaneously form interconnects between aligned bond pads of the flip chip and the substrate.

Use of metals to interconnect bond pads of flip chips and substrates has required, however, that passivation of the flip chip be accomplished by use of a metal barrier such as titanium (Ti), tungsten (W) or silicon nitride ($Si_3N_4$). Both the metal, as a passivation (or barrier) material, and ceramic, as a substrate material, are generally necessitated to allow sufficient heating to enable reflow of the solder bumps for interconnection between the flip chip and the substrate without consequential damage to either.

Fabrication of circuits using bumped flip chips have also been limited by the inability to visually inspect interconnections between the flip chip and the substrate. Further, the yield of finished mounted circuits can be detrimentally affected by failure of interconnects caused by the difference between the coefficients of thermal expansion of the various materials comprising the flip chip, the passivation layer, the solder bumps and the substrate. Also, melting of the solder bumps creates an electrically conductive flux as an undesirable byproduct which generally must be removed from between the substrate and the flip chip to allow proper operation of the finished circuit.

Problems of heat stress during fabrication have been addressed by various methods, such as by rapid application of heat to a bumped flip chip and rapid conduction of heat from the solder interconnects in order to minimize damage to flip chips, substrates and interconnections due to internal stresses caused by thermal expansion and contraction. However, this method is very expensive.

Therefore, a need exists for a method of interconnection substrates such as flip chips, lead frames, multichip modules and printed circuit boards, which is fast, cost-effective and reliable. Also, there is a demand for a simplified method of interconnecting substrates which eliminates the need for elaborate plating procedures. Further, a method which enables greater flexibility of passivation and choice of substrate is also desirable. These improvements could promote cost efficiency and broaden the applications for which microcircuits are suitable.

SUMMARY OF THE INVENTION

The present invention relates to a method of forming electrical interconnection bumps on bond pads of a substrate. In accordance with the present invention, an electrically conductive polymer bump is formed on each of a first set of bond pads of a substrate. An electrically conductive polymer bump is then formed on each of a second set of the bond pads of the substrate.

In one specific embodiment of the invention, a first template is aligned over the substrate. The template has openings which coincide with each of the first set of bond pads of the substrate. Bumps of electrically conductive polymer are formed on each of the first set of bond pads by directing the electrically conductive polymer through said aligned openings of the first template and onto each of the first set of bond pads. The first template is then removed from the substrate and a second template is aligned over the substrate. The second template has openings which coincide with each of the second set of the bond pads of the substrate. Bumps of electrically conductive polymer are then formed on each of the second set of bond pads by directing the electrically conductive polymer through said aligned openings of the second template and onto each of the second set of bond pads. The second template is then removed from the substrate.

Further, an electrical circuit can be formed by the method of the invention. A second substrate is coated with an organic protective layer. Bond pads on the second substrate which coincide with the bond pads on the first substrate are exposed by laser ablation of the organic coating. The electrically conductive polymer bumps are then contacted with the bond pads of the second substrate to form the electrical circuit.

Formation of electrically conductive polymer bumps in two separate steps allows the formation of distinct polymer bumps in very close proximity to each other. Resulting distances, or pitch, between polymer bumps can be on the order of about one mil, as opposed to known methods, which are limited to formation of polymer bumps having a pitch of at least about six mils.

Also, organic protective coatings can be selectively formed on substrates by removing portions of the coating by laser ablation. Bond pads on the substrate are thereby exposed for contact with electrically conductive polymer bumps on another substrate. Laser ablation allows precise control over the dimension of the openings formed in the organic protective layer. Also, residual coating remaining on the exposed bond pad is nominal when laser ablation is employed.

Further, forming an electrical circuit by a method which includes contacting electrically conductive bumps on a first substrate with bond pads of a second substrate having a selectively formed dielectric coating eliminates resultant void space between the substrates. Consequently, the need to underfill void space is also eliminated. In addition, the organic protective layer provides improved strength of the resultant circuit and typically has an improved thermal conductivity relative to known underfill materials. The present method also forms circuits which are protected from attack by moisture and essentially eliminates the potential for formation of voids between the substrate of the circuit.

DESCRIPTION OF THE PREFERRED EMBODIMENTS

The above features and other details of the invention, either as steps of the invention or as combinations of parts of the invention, will now be more particularly described with reference to the accompanying drawings and pointed out in the claims. It will be understood that the particular embodiments of the invention are shown by way of illustration and not as limitations of the invention. The principle feature of the invention may be employed in various embodiments without departing from the scope of the invention.

Figure 1:
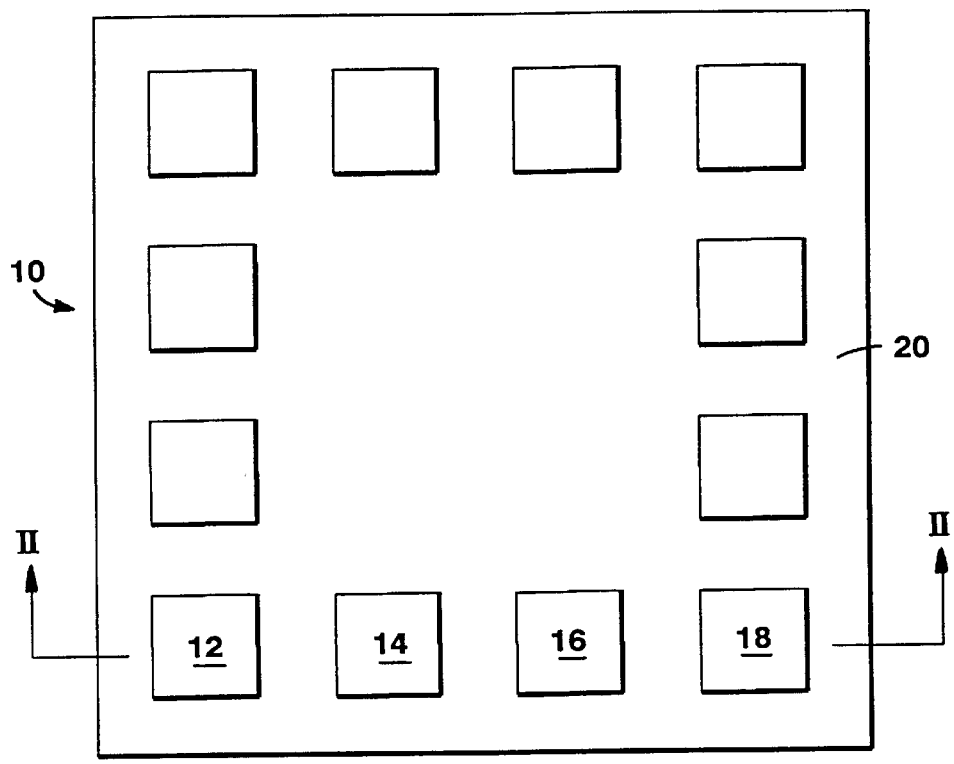
FIG. 1 is a plan view of one embodiment of a substrate employed by the method of the present invention.

In one embodiment of the method of the present invention, a suitable substrate 10, such as that shown in FIG. 1, has electrical bond pads 12,14,16,18 on upper planar surface 10 of the substrate. Examples of suitable substrates include flip chip dies, lead frames, multichip modules printed circuit boards, etc. Substrate 10 is formed of a suitable material, such as silicon, gallium arsenide, germanium or some other conventional semiconductor material.

Figure 2:
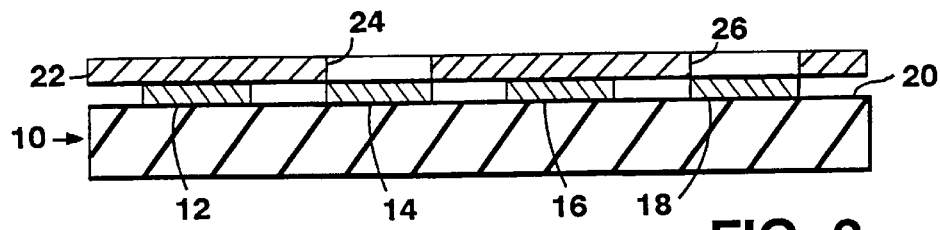
FIG. 2 is a section view of the substrate of FIG. 1 taken along line II—II, and after a first template has been placed over the substrate.

As can be seen in FIG. 2, a first template 22 is placed over upper planer surface 20 of substrate. First template 22 has openings 24,26 which are aligned with bond pads 14,18 which are a first set of the bond pads of substrate 10 is covered by template 22.

As defined herein, the first set of bond pads of substrate 10 are those bond pads which are exposed by placement of the first template on substrate 10. The second set of the bond pads, as defined herein, are those bond pads which are covered by placement of the first template on substrate 10. In a specific embodiment, at least one bond pad of the second set of bond pads is located between bond pads of the first set. As seen in FIG. 2, bond pads 14,18 represent the first set and bond pads 12,16 represent the second set of the bond pads of substrate 10.

First template 22 is suitable for screen printing electrically conductive polymer bumps onto the first portion of bond pads of substrate 10. An example of a suitable template is a Laseretch stencil, commercially available from IRI.

Typically, the distance between the centers of bond pads of the first portion from the centers of bond pads of the second portion, also known as "pitch," is in the range of between about 1 and five mils. Generally, the pitch between bond pads of the second set is greater than about two mils. It is to bee understood, however, that the pitch between bond pads of the first portion from bond pads of the second set can be greater than five mils. Also, bond pads on substrate 10 can be arranged peripherally, in a staggered arrangement, or in an array on upper planar surface of the substrate 10.

Figure 3:
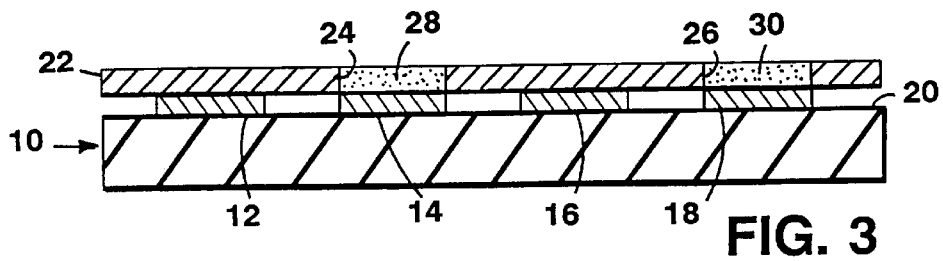
FIG. 3 is a section view of the substrate and template shown in FIG. 2 after electrically conductive polymer bumps have been formed on a first set of bond pads at the substrate.
Figure 4:
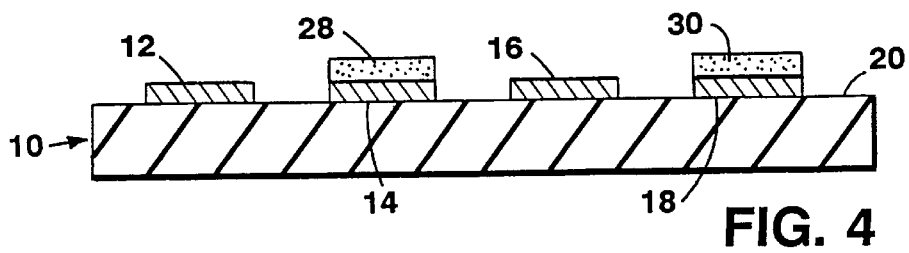
FIG. 4 is a section view of the substrate and electrically conductive bumps as shown FIG. 3, following removal of the template.

As shown in FIG. 3, electrically conductive polymer bumps 28,30 are formed by directing the electrically conductive polymer through openings 24,26, respectively, of template 22 and onto the first set of the bond pads of substrate 10. Typically, electrically conductive bumps 28,30 are formed of a B-stage polymer or a thermoplastic polymer. The electrically conductive polymer bumps can be gold-filled, silver-filled, or filled with some other electrically conductive polymer bumps 28,30 is about flush with an upper surface 32 of template 22. Template 22 is then removed from substrate 10, thereby leaving free-standing electrically conductive polymer bumps 28,30 on the first set of bond pads of substrate 10, as shown in FIG. 4.

Figure 5:
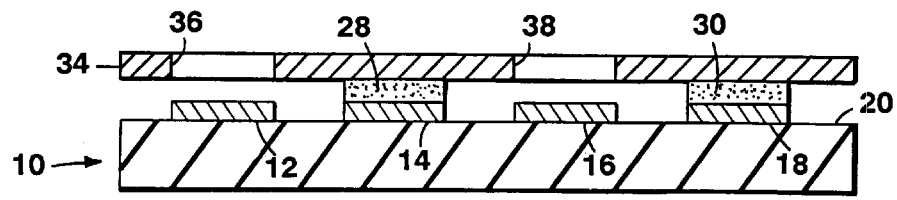
FIG. 5 is a section view of the electrically conductive bumps and substrate shown in FIG. 4, and of a second template placed over the substrate and electrically conductive polymer bumps.

Second template 34 is then placed over substrate 10 and electrically conductive polymer bumps 28,30 at the first set of the bond pads, as shown in FIG. 5. Second template 34 includes openings 36,38. The openings of second template 34 are aligned with bond pads 12, 16 which represent the second set of the bond pads of substrate 10. Second template 34 is of the same type of construction, and is fabricated in the same way, as first template 22, except that openings 36,38 of second template 34 are aligned with the second set of bond pads, rather than with the first set of bond pads.

Figure 6:
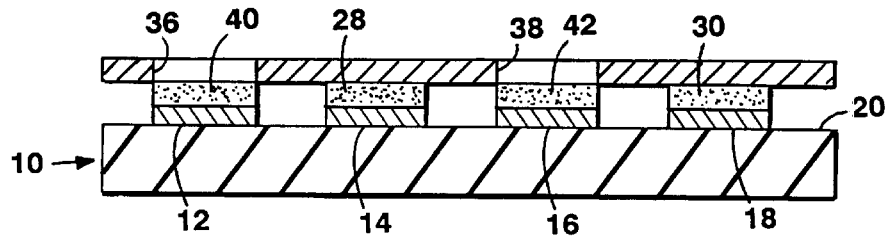
FIG. 6 is a section of view of the substrate and template shown in FIG. 5 after an electrically conductive bump has been formed on a second set of the bond pads at the substrate.
Figure 7:
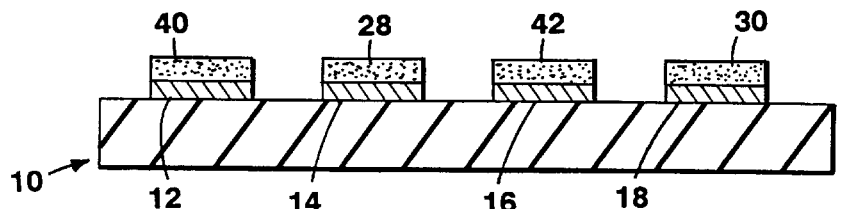
FIG. 7 is a section view of the electrically conductive bumps formed on the bond pads of the substrate after the second template has been removed.

As shown in FIG. 6, electrically conductive polymer bumps 40,42 are formed by a suitable method, such as stenciling, whereby the electrically conductive polymer is directed through openings 36,38 of second template 34 onto the second set of bond pads, which are bond pads 12,16. However, the height of the electrically conductive polymer bumps 40,42 formed on the second set of the bond pads is about the same as that of the electrically-conductive bumps formed on the first set of the bond pads. Any resultant differences in heights between the electrically conductive polymer bumps formed on the first set of bond pads and of and of the bumps formed on the second set of bond pads is small enough not to affect the formation of electrical interconnections between substrate 10 and a second substrate during fabrication of an electrical circuit. As shown in FIG. 7, following removal of second template 34, electrically conductive polymer bumps 28,30,40,42 extend from the first and second sets of the bond pads of substrate 10.

Optionally, an organic protective layer, not shown, can be formed on substrate 10 either prior to, or following, formation of the electrically conductive polymer bumps, as described in U.S. Pat. No. 5,237,130, the teachings of which are incorporated by reference. Generally, however an organic protective layer will be formed on upper planar surface 20 of substrate 10 only as a heat sink, which is employed during operation of the fabricated electrical circuit that includes substrate 10.

Figure 8:
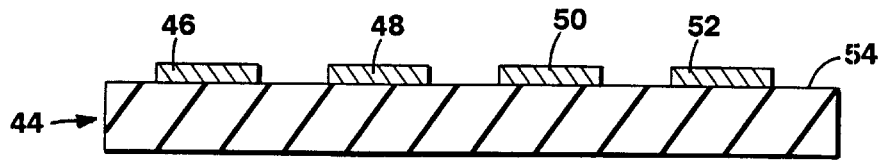
FIG. 8 is a section view of a second substrate suitable for use in an optional embodiment of the invention.
Figure 9:
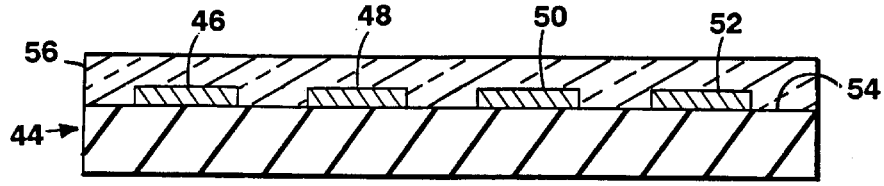
FIG. 9 is a section view of the substrate shown in FIG. 8 following coating of the substrate and bond pads of the substrate with an organic protective layer, according to the method of the present invention.
Figure 10:
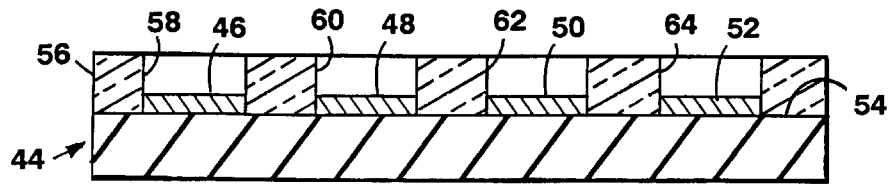
FIG. 10 is a section view on the substrate and organic protective layer shown in FIG. 9 following laser ablation of portions of the organic protective layer which cover the bond pads of the substrate.

As can be seen in FIG. 8, second substrate 44 includes bond pads 46,48,50,52. Examples of suitable substrates include flip chips, lead frames, multichip modules and printed circuit boards. Bond pads 46,48,50,52 can be arranged in a peripheral pattern about upper surface 54 of substrate 44, in a staggered pattern, or in an array. Generally, bond pads 46,48,50,52 of second substrate 44 are arranged for alignment with electrically conductive polymer bumps 28,30,40,42 of first substrate 10.

Organic protective layer 56 is formed over substrate 44 and bond pads 46,48,50,52 of substrate 44 by a suitable method. Optionally, substrate 44 can be passivated with silicon nitride or an oxide layer, not shown, before formation of organic protective layer 56. Organic protective layer 56 is preferably a dielectric polymer. An example of a organic material suitable for application in the present invention is Epo-Tek®, manufactured Epoxy Technology, Inc. Organic protective layer 56 passivates and thereby insulates and protects underlying surface 54 of second substrate 44.

Bond pads 46,48,50,52 of second substrate 44 are then exposed by laser ablation of organic protective layer 44 to form openings 58,60,62,64. Preferably, laser ablation is preformed by employing an Excimer-type laser. Preferably, the thickness of organic protective layer 56 is about equal to the combined thickness of bond pads 12,14,16,18,46,48,50, 52 of first and second substrates, and of electrically conductive polymer bumps 28,30,40,42.

Figure 11:
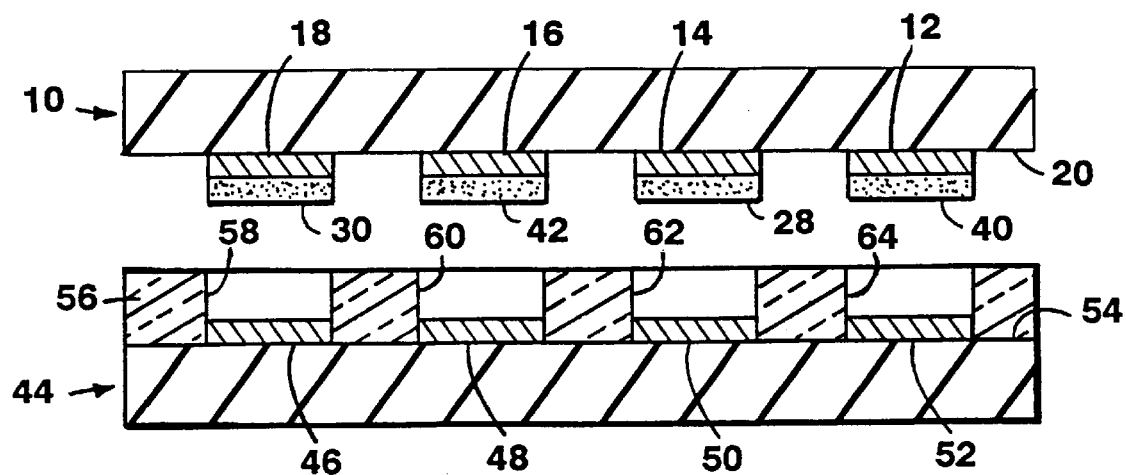
FIG. 11 is a section view of the substrate and laser ablated organic protective layer of FIG. 10, and of the substrate of FIG. 7, having electrically conductive polymer bumps at the bond pads of the substrate.
Figure 12:
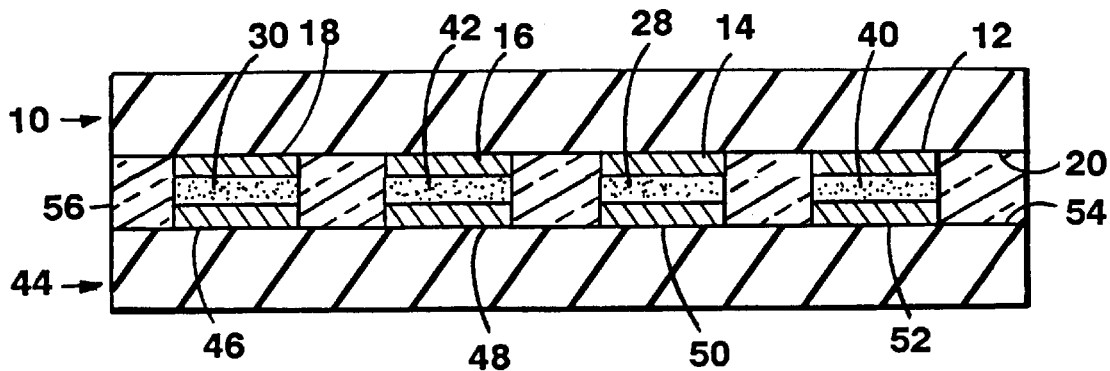
FIG. 12 is a section view of an electrical circuit formed by contacting the electrically conductive polymer bumps at the first substrate with the bond pads at the second substrate, whereby void space between the first and second substrate is eliminated by the organic protective layer formed on the second substrate.

As shown in FIG. 11, electrically conductive polymer bumps 28,30,40,42 at bond pads 12,14,16,18, of first substrate 10 are aligned with bond pads 46,48,50,52 of second substrate 44. Then, shown in FIG. 12, electrically conductive polymer bumps 28,30,40,42 are contacted with bond pads 46,48,50,52 of second substrate 44, thereby forming an electrical circuit of the first and second substrates. Typically, an adhesive, not shown is formed on bond pads 46,48,50,52 of second substrate 44 before electrically conductive polymer bumps 28,30,40,42 are contacted to bond pads 46,48, 50,52 of second substrate 44. Examples of adhesives which can be used includes theromsets, thermoplastics and polymer thick film. Adhesive is typically formed on substrate bond pads 46,48,50,52 by screen printing, templating, or by some other conventional method.

In a preferred embodiment, first substrate 10 is aligned over second substrate 44 by an aligner bonder, such as a Model M-8 aligner bonder, manufactured by Research Devices, Division of the America Optical Corporation.

Equivalents

Although preferred embodiments have been specifically described and illustrated herein, it will be appreciated that many modifications and variations of the present invention are possible, in light of the above teachings, within the purview of the following claims, without departing from the spirit and scope of the invention. For example, while the discussion is directed to a single substrate, or to two substrates to form only one circuit, it is to be understood that the concept can be readily expanded to include more substrates, with bond pads on each, bonded to form a plurality of circuits.

What is claimed is:

1. A method of electrically connecting conductive contact pads of a first substrate to conductive contact pads of a second substrate, comprising the steps of:

selectively forming an organic protective layer over a surface of one of the substrates where the contact pads of that one substrate are located, leaving the contact pads of that one substrate exposed;

stenciling electrically conductive polymer bumps onto the contact pads of one of the substrates;

positioning the contact pads of the first substrate in alignment with the contact pads of the second substrate and with the electrically conductive bumps being disposed between the aligned contact pads; and electrically connecting the contact pads of the first substrate to the contact pads of the second substrate through the electrically conductive bumps.

2. The method of claim 1 wherein the step of stenciling electrically conductive polymer bumps comprises stenciling polymer bumps filled with silver.

3. The method of claim 1 wherein the first substrate comprises a flip chip substrate and wherein the second substrate comprises a circuit substrate.

4. The method of claim 3 wherein the organic protective layer is selectively formed over a surface of the flip chip substrate and wherein the electrically conductive polymer bumps are stenciled onto the contact pads of the flip chip substrate.

5. A method of electrically connecting conductive contact pads of a first substrate to conductive contact pads of a second substrate, comprising the steps of:

selectively forming an organic protective layer over a surface of one of the substrates where the contact pads of that one substrate are located, leaving the contact pads of that one substrate exposed;

stenciling electrically conductive polymer bumps onto the contact pads of the first substrate;

screen printing electrically conductive polymer bumps onto the contact pads of the second substrate;

positioning the contact pads of the first substrate in alignment with the contact pads of the second substrate and with the electrically conductive bumps being disposed between the aligned contact pads; and electrically connecting the contact pads of the first substrate to the contact pads of the second substrate through the electrically conductive bumps.

6. The method of claim 5 wherein the first substrate comprises a flip chip substrate and the second substrate comprises a circuit substrate.

7. A method of electrically connecting conductive contact pads of a first substrate to conductive contact pads of a second substrate, comprising the steps of:

stenciling electrically conductive polymer bumps onto the contact pads of the first substrate;

selectively forming an organic protective layer over a surface of the second substrate where the contact pads of the second substrate are located, leaving the contact pads of the second substrate exposed;

screen printing electrically conductive polymer bumps onto the contact pads of the second substrate;

positioning the contact pads of the first substrate in alignment with the contact pads of the second substrate and with the electrically conductive bumps being disposed between the aligned contact pads; and electrically connecting the contact pads of the first substrate to the contact pads of the second substrate through the electrically conductive bumps.

8. The method of claim 7 wherein the first substrate comprises a flip chip substrate and wherein the second substrate comprises a circuit substrate.

9. The method of any of claims 1, 5, or 7 wherein the step of selectively forming an organic protective layer leaving the contact pads exposed comprises screen printing the organic protective layer.

10. The method of any of claims 1, 5, or 7 wherein the organic protective layer comprises a dielectric polymer.

11. The method of claim 10 wherein the organic protective layer comprises. polyimide.

12. The method of any of claims 1, 5, or 7 wherein the electrically conductive polymer bumps comprise thermoset bumps.

13. The method of any of claims 1, 5, or 7 wherein the electrically conductive polymer bumps comprise thermoplastic bumps.

14. The method of any of claims 1, 5, or 7 wherein the electrically conductive polymer bumps comprise B-stage polymer bumps.

* * * * *